US006968017B2

(12) United States Patent
Nielsen

(10) Patent No.: US 6,968,017 B2
(45) Date of Patent: Nov. 22, 2005

(54) LOW PHASE NOISE FREQUENCY CONVERTER

(75) Inventor: Gert Lynge Nielsen, Bagsværd (DK)

(73) Assignee: Unique Broadband Systems, Inc., (CA)

( * ) Notice: Subject to any disclaimer, the term of this patent is extended or adjusted under 35 U.S.C. 154(b) by 832 days.

(21) Appl. No.: 09/899,430

(22) Filed: Jul. 5, 2001

(65) Prior Publication Data

US 2002/0006171 A1    Jan. 17, 2002

Related U.S. Application Data

(60) Provisional application No. 60/230,675, filed on Sep. 7, 2000, provisional application No. 60/216,197, filed on Jul. 6, 2000.

(51) Int. Cl.[7] .......................... H04K 1/10; H04L 27/28
(52) U.S. Cl. ...................................................... 375/316
(58) Field of Search ................................ 375/316, 326, 375/295, 344, 347; 370/308; 455/49, 73, 455/75, 76, 91, 118, 119, 161, 164, 182, 192; 348/725, 735

(56) References Cited

U.S. PATENT DOCUMENTS

| | | | |
|---|---|---|---|
| 4,152,669 A | | 5/1979 | Igarashi |
| 4,259,644 A | | 3/1981 | Iimura |
| 4,491,976 A | | 1/1985 | Saitoh et al. |
| 4,726,072 A | * | 2/1988 | Yamashita et al. ........ 455/189.1 |
| 5,282,222 A | | 1/1994 | Fattouche et al. |
| 5,388,125 A | * | 2/1995 | Toda et al. .................. 375/332 |
| 5,574,998 A | * | 11/1996 | Andoh ..................... 455/182.2 |
| 5,648,985 A | * | 7/1997 | Bjerede et al. ............. 375/219 |
| 5,726,973 A | | 3/1998 | Isaksson |
| 5,949,796 A | | 9/1999 | Kumar |
| 6,052,419 A | * | 4/2000 | Hioki ........................ 375/344 |
| 6,160,858 A | * | 12/2000 | Hindman et al. ........... 375/336 |
| 6,320,915 B1 | * | 11/2001 | Stott et al. .................. 375/340 |

OTHER PUBLICATIONS

European Search Report for corresponding European Patent Application No. EP 01 30 5689, Nov. 5, 2003; 2 pp.

* cited by examiner

Primary Examiner—Mohammed Ghayour
Assistant Examiner—Krista Flanagan
(74) Attorney, Agent, or Firm—Armstrong Teasdale LLP

(57) ABSTRACT

One aspect of the present invention is a frequency conversion circuit having a pair of local oscillators. The local oscillators are frequency synthesizers based on an external frequency reference. The frequency conversion circuit is configured to perform a frequency conversion to an input signal equal to a frequency difference of signals from the pair of local oscillators; to generate an oscillator frequency difference signal; to generate an error signal using the oscillator frequency difference signal and an internal reference signal derived from the external frequency reference; and to adjust a phase of one of the pair of oscillators using the error signal. The above-described frequency conversion circuit embodiment essentially eliminates divider phase noise such as that generated by traditional prescalers. In addition, the use of two local oscillators provides a frequency conversion circuit capable of wide-range frequency conversion and high resolution. This frequency conversion circuit embodiment is suitable for receivers as well as transmitters, and is particularly suitable for digital television systems.

19 Claims, 7 Drawing Sheets

LOW PHASE NOISE FREQUENCY CONVERTER

This application claims the benefits of U.S. Provisional Application No. 60/216,197 filed Jul. 6, 2000, entitled "Digital television system using coherent orthogonal frequency division coder/modulator" and of U.S. Provisional Application No. 60/230,675, filed Sep. 7, 2000, entitled "Low phase noise upconverter/tuner for digital television system," both of which are hereby incorporated by reference in their entirety.

BACKGROUND

This invention relates generally to frequency conversion methods and apparatus, and more specifically to low phase noise frequency conversion methods and apparatus particularly suitable for reception and transmission of digital signals including multi-carrier modulated signals.

The European Broadcasting Union (EBU) European Telecommunications Standards Institute (ETSI) Joint Technical Committee (JTC) has published a draft standard EN300 744 v. 1.2.1 (1999–01) for digital television broadcasting, specifying the framing structure, channel coding, and modulation for digital terrestrial television. This standard functionally defines the equipment needed for adaptation of a baseband TV signal from an output of an MPEG-2 (Motion Picture Experts Group-2) transport multiplexer to the terrestrial channel characteristics. ODFM (Orthogonal Frequency Division Multiplexing) with concatenated error correction coding is specified. To achieve the conversion of an MPEG-2 transport stream to an ODFM signal, transport multiplex adaptation and randomization is applied to the input signal. Outer Reed-Solomon (RS) and outer convolutional interleaving is then applied. Next, an inner coding, for example, a punctured convolutional code, is applied with inner interleaving. Finally, a mapping and modulation step is performed, followed by ODFM transmission. The standard allows for either 8, 7, or 6 MHz channel spacings, and both a "2K mode" and an "8K mode." The "2K mode" is useful for single transmitter operation and small single frequency networks (SFNs) with limited transmitter distances, while the "8K mode" is suitable for both signal transmitter operation and for small and large SFN networks. Different levels of quadrature amplitude modulation (QAM) and different inner code rates are allowed.

The standard is defined in the context of broadcast television transmission. However, the apparatus and process for the conversion of MPEG-2 transport streams into broadcast-compatible digital television coding would be useful for many applications. For example, it would be desirable to provide methods and apparatus for a portable transport stream adapter that can be used for portable television equipment of all kinds, such as electronic news gathering (ENG) equipment. It would also be desirable to provide improved modulation error rate performance, better modulation shoulders and immunity to phase noise, and improved timing accuracy for such equipment.

A digital television system implementing the ETSI standard for digital television broadcasting further requires the conversion of the OFDM signal from a baseband signal to an IF signal and from an IF signal to an RF signal. This latter frequency conversion typically results in the introduction of significant phase noise partially attributable to divider noise. In an IF to RF frequency converter, the input IF signal is mixed with two oscillator signals to upconvert the IF signal to an RF signal. The frequency shift corresponds to the difference between the frequencies of the two oscillators. The oscillator signals are synthesised based upon an external reference signal. The accuracy of the oscillator signals is controlled by the comparing the external reference with the oscillator signal divided by an appropriate factor. This comparison results in a error signal that can be used by the synthesiser to adjust the oscillator signal. The operation of dividing the oscillator signal introduces phase noise that becomes amplified and introduced into the oscillator signal and that then corrupts the output RF signal. A further difficulty is that the resolution of a frequency converter wherein the oscillators are controlled by frequency synthesizers is limited by the step size of the frequency synthesizers.

It would be desirable to provide an apparatus and method of frequency conversion, possible of wide application, with improved phase noise performance and greater frequency resolution.

BRIEF SUMMARY OF THE INVENTION

One aspect of the present invention is a frequency conversion circuit having a pair of local oscillators. The local oscillators are frequency synthesizers based on an external frequency reference. The frequency conversion circuit is configured to perform a frequency conversion to an input signal equal to a frequency difference of signals from the pair of local oscillators; to generate an oscillator frequency difference signal; to generate an error signal using the oscillator frequency difference signal and an internal reference signal derived from the external frequency reference; and to adjust the frequency of one of the pair of oscillators using the error signal.

The above-described frequency conversion circuit embodiment essentially eliminates divider phase noise such as that generated by traditional prescalers. In addition, the use of two local oscillators provides a frequency conversion circuit capable of wide-range frequency conversion and high resolution. This frequency conversion circuit embodiment is suitable for receivers as well as transmitters, and is particularly suitable for multi-carrier modulated systems such as OFDM digital television systems.

In another aspect, the present invention is a frequency converter for shifting the frequency of an input signal by a desired frequency and that receives an external reference frequency signal, the frequency converter including a frequency converter circuit comprising a first oscillator and a second oscillator, and wherein the frequency of the input signal is shifted by the difference in frequency between the first oscillator and the second oscillator, the frequency of the second oscillator being adjustable in response to a error signal; and a sampling circuit including a pulse train generator, a comparison circuit and a sampler, the pulse train generator receiving the external reference frequency signal and generating a pulse train with an nth order harmonic at the desired frequency, the comparison circuit adapted to generate a difference signal at a frequency corresponding to the frequency difference between the first oscillator frequency and the second oscillator frequency, and the sampler adapted to receive the pulse train and the difference signal and to generate a error signal at a frequency corresponding to the difference between the frequency of the difference signal and the frequency of the Nth order harmonic.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made, by way of example, to the accompanying drawings which show a preferred embodiment of the present invention, and in which.

DETAILED DESCRIPTION OF THE INVENTION

Figure 1:
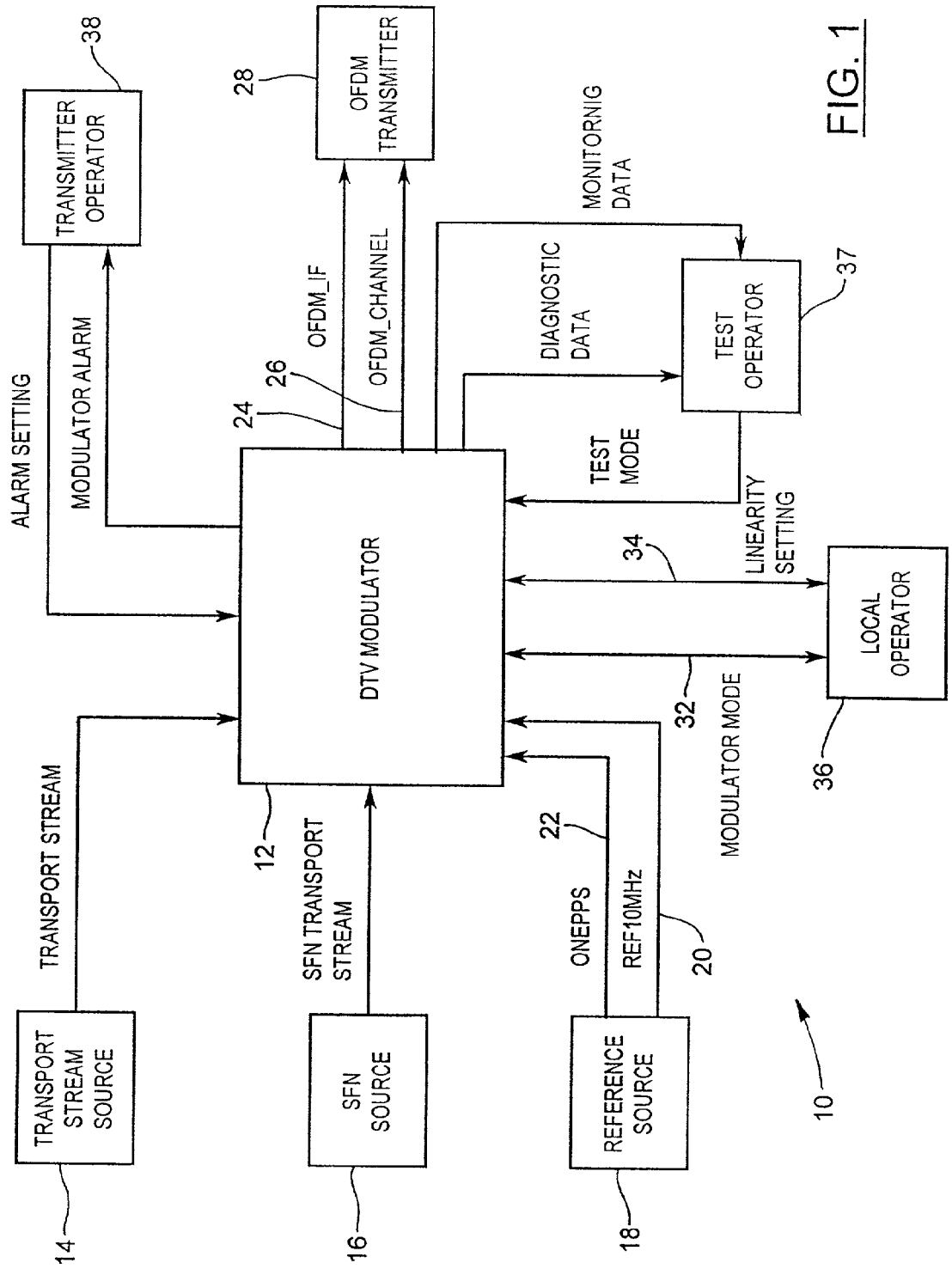
FIG. 1 is a simplified block diagram of one embodiment of a digital TV system of the present invention.

Referring to the simplified block diagram of FIG. 1, one aspect of the present invention is a digital TV system 10 that, in one embodiment, includes a single board DTV (digital television) modulator 12. DTV modulator 12 receives inputs from at least one source, such as a transport stream source 14 and/or an SFN (Single Frequency Network) source 16. DTV modulator 12 also receives reference inputs from a reference source 18, which includes a 10 MHz reference signal 20 and a 1 PPS reference signal 22. In one embodiment, reference signals 20 and 22 are highly accurate timing signals derived from GPS (Global Positioning System) satellites. These inputs are processed by DTV modulator 12 to produce outputs 24, 26 that are transmitted by OFDM (Orthogonal Frequency Division Multiplex) transmitter 28. Information concerning modulator mode 32 and linearity setting 34 are exchanged with a local operator 36, and various tests, alarms and monitoring data are exchanged with a test operator 37 and a transmitter operator 38, although not all embodiments provide test, alarms and/or monitoring data.

Figure 2:
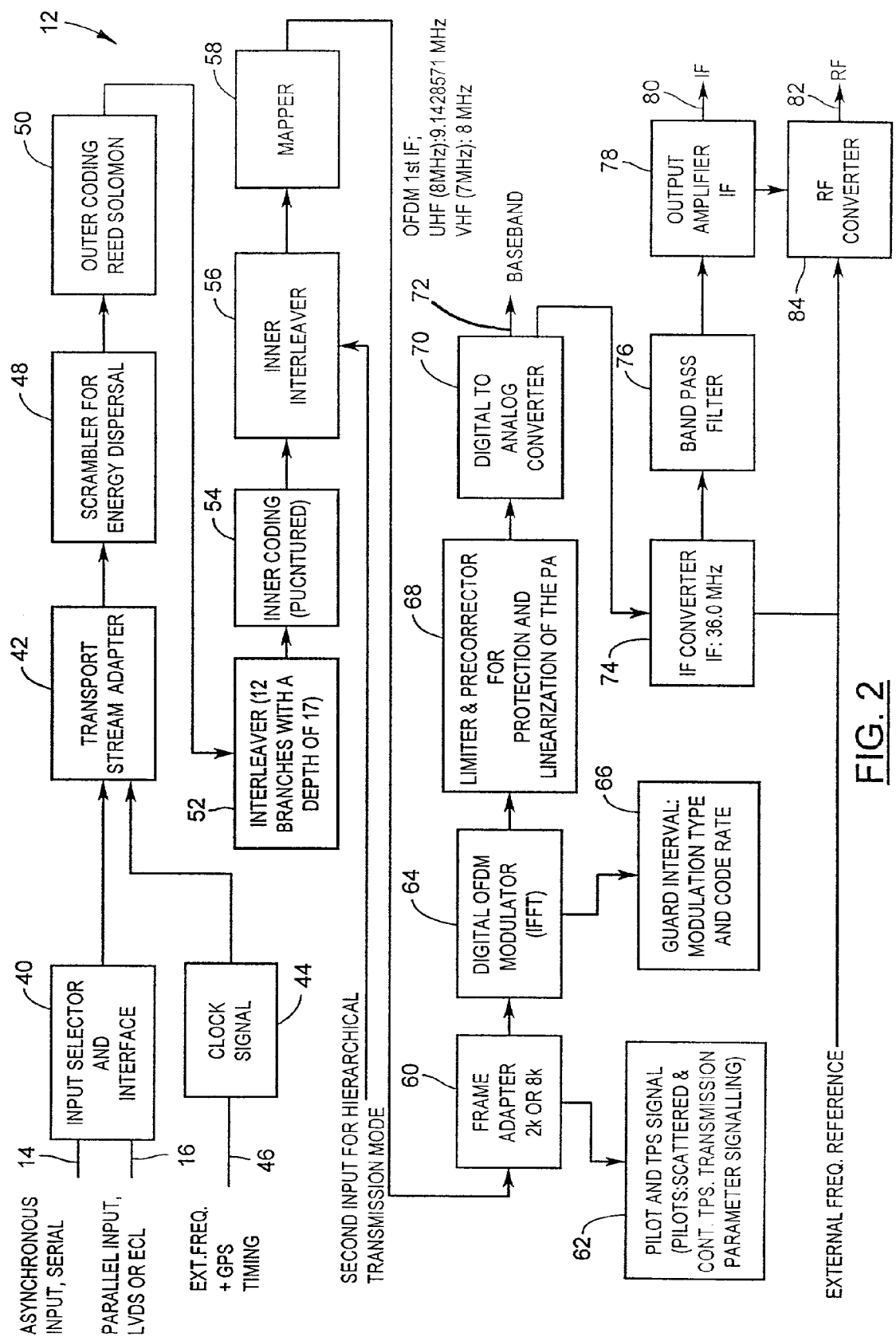
FIG. 2 is a simplified block diagram of an embodiment of a DTV modulator system.

A block diagram of an embodiment of a DTV modulator system 12 is shown in FIG. 2. Digital TV modulator system 12 comprises an input selector and interface 40 having two inputs 14, 16. Input 14 is an asynchronous serial input (e.g., coaxial, high-speed input), while input 16 is a parallel input (e.g., 8 inputs, with handshake). Parallel input 16 is either a low voltage differential signal or an emitter-coupled logic signal, for example. Input selector and interface 40 acts as a two-input switch, selecting between inputs 14 and 16. Input selector and interface 40 also checks the input format (using a microprocessor, for example) and provides information to transport stream adapter 42 for forward error correction (e.g., a 188 byte to 204 byte bandwidth sync word, where the total packet length of an MPEG-2 transport multiplex [MUX] packet is 188 bytes, with error correction bringing the total to 204 bytes). A clock signal generator 44 produces clock signals including a 10 MHz reference signal 20 and a 1 PPS reference signal 22 and provides these signals to transport stream adapter 42. In one embodiment, clock signal generator 44 comprises a temperature compensated crystal oscillator locked to a GPS (global positioning satellite) derived external reference 46.

Transport stream adapter 42 adapts for a type of signal input to DTV modulator system 12. In one embodiment, transport stream adapter 42 checks for empty bits or "stuffing" in the transport stream. These empty bits are necessary for proper framing, but are not otherwise useful as data. Transport stream adapter 42 also checks a header of the input stream data. In one embodiment, for example, inputs 14 and 16 provide information on channel capacity. Transport stream adapter 42 adapts the transport stream by adding or removing stuffing based on the determined capacity. For example, in one embodiment, 16-QAM (quadrature amplitude modulation) using 4-bit processing is converted to 64-QAM, which uses 6-bit processing.

Scrambler 48 disperses energy in the input stream by multiplying a sequence into the transport stream, thereby randomizing it and minimizing visual disturbances. A polynomial used for scrambling is $1+x^{14}+x^{15}$, where the polynomial description corresponds to Satellite baseline specification EN 300 421. This notation is to be distinguished from that used in the standard textbook by Peterson and Weldon, "Error Correcting Codes," second edition, MIT Press 1972. Outer coder 50 is a Reed-Solomon coder, which adds bytes to the transport stream using a (204, 188, t=8) shortened code derived from the original systematic RS (255, 239 t=8) code. This encoder adds bytes to the transport stream that are used to check errors in a signal received at the receiver. Interleaving of bytes and inner coding is also provided, and a further interleaving of bits is also provided to further randomize the bit error pattern. An outer byte interleaver 52 operates on the output of Reed-Solomon coder 50 to separate consecutive bytes. The output of outer byte interleaver 52 is encoded by a inner punctured convolutional coder 54, which is in turn followed by an inner bit interleaver 56. The output of inner bit interleaver 56 is applied to mapper 58, which defines or maps the input data to a plurality of carriers. Pilot transmission parameter signaling symbols frame→68 OFDM simple, where OFDM simple is 204 bytes.

In one embodiment, the Reed-Solomon code used has length 204 bytes, dimension 188 bytes, and corrects up to 8 random errors in a received word of 204 bytes. The code generator polynomial is:

$$g(x)=(x+\lambda^0)(x+\lambda^1)(x+\lambda^2)\ldots(x+\lambda^{15}), \text{ where } \lambda=02_{HEX},$$

and the field generator polynomial is:

$$p(x)=x^8+x^4+x^3+x^2+1.$$

In one embodiment, the shortened RS code is implemented by adding 51 bytes, all set to zero, before information bytes input to a (255, 239, t=8) encoder. After encoding, the null bytes are discarded. Outer interleaving follows with depth I=12, and packets are delimited by inverted or non-inverted MPEG-2 sync bytes, preserving the periodicity of 204 bytes. Inner coding using a range of punctured convolutional codes is provided to allow selection of an appropriate level of error correction. An inner interleaver provides bit-wise interleaving followed by symbol interleaving.

The mapped data from mapper 58 is applied to a frame adapter 60, which adapts the data to either 2K or 8K frames, as appropriate. Each frame is 68-OFDM simple, where "OFDM simple" is 204 bytes. Pilot or transmission parameter signaling (TPS) is applied by Pilot/TPS unit 62. The output of frame adapter 60 is provided as the input of IFFT (Digital OFDM) modulator 64. IFFT 64 calculates an envelope of the input signal, converting its time-domain input into the frequency domain. IFFT 64 thus determines which information from its input will be carried on which carrier frequency. Guard interval inserter 66 provides information to IFFT 64 concerning the required guard intervals, as well as the modulation type and code rate.

The output of IFFT 64 is input to limiter/precorrector 68, which checks the digital values output by IFFT 64 to prevent overload of DAC (Digital to Analog Converter) 70 and subsequent components in modulator 12. Limiter/precorrector 68 applies clipping as necessary to prevent overload. DAC 70 produces a base band (or first IF signal) 72 that is either a 9.1428571 MHz signal (corresponding to an 8 MHz bandwidth UHF channel) or an 8 MHz signal (corresponding to a 7 MHz VHF channel). In other embodiments, base band signals having different characteristics are produced to correspond with different standards.

In the embodiment exemplified by FIG. 2, a base band signal output by DAC 70 is upconverted by IF converter 74. For example, an IF frequency of 36.0 MHz is used. The output of IF converter 74 is filtered with a band pass filter 76 and amplified by output IF amplifier 78. The IF signal is converted to a suitable RF signal 82 by RF converter 84. RF signal 82 can be further amplified or processed, depending upon the application in which modulator 12 is used.

Figure 3:
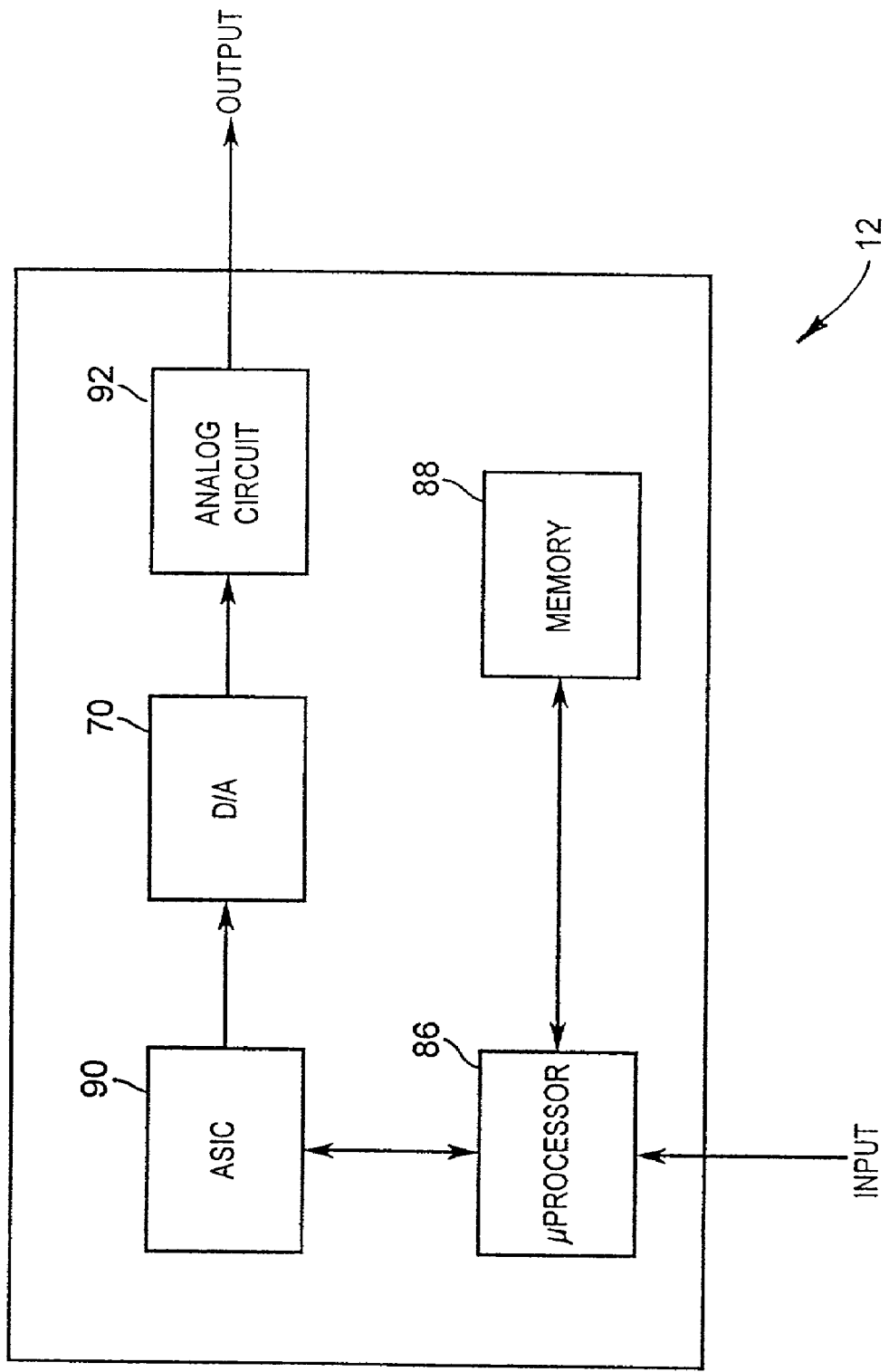
FIG. 3 is a simplified block diagram of another embodiment of a DTV modulator.

In one embodiment and referring to FIG. 3, DTV modulator 12 comprises a microprocessor 86 and associated memory 88, an application specific integrated circuit (ASIC) 90, a digital to analog converter (DAC) 70, and analog circuitry 92. The architecture of modulator 12 in this embodiment provides an advantage of allowing instruction set changes without hardware redesign. In particular, functions of blocks 40, 42, 44, 48, 50, 52, 54, 56, 58, 60, 62, 64, 66, and/or 68 are divided between ASIC 90 and microprocessor 86 (and its associated memory 88). For example, in one embodiment, ASIC 90 performs the functions of IFFT 64 and limiter/precorrector 68, while microprocessor 86 performs the functions of guard interval inserter 66 and blocks preceding block 64 in the processing chain. Analog circuit 92 performs the functions of IF converter 74, band pass filter 76, output IF amplifier 78 and RF converter 84.

In one embodiment IFFT 64 is embodied in ASIC 90 and comprises a plurality of signal processors to generate carriers with excellent resolution to provide the high speed operation that is necessary for handling high speed data streams. For example, ten signal processors are provided, each with sixteen-bit accuracy to provide improved resolution.

More particularly, in one embodiment, 6,817 carriers are used in an 8 MHz band to provide high speed. The 8 MHz bandwidth is achieved by using the large number of equally spaced carriers. In another embodiment, approximately 8,000 carriers are available for data modulation, and error correction and interleaving techniques are used so that signals can be recovered even if a number of these carriers are lost. A guard interval is provided to freeze a signal so that the receiver has time to detect a television signal. Once the signal is stable for a period of time, the receiver can then start displaying the demodulated signal.

Figure 4:
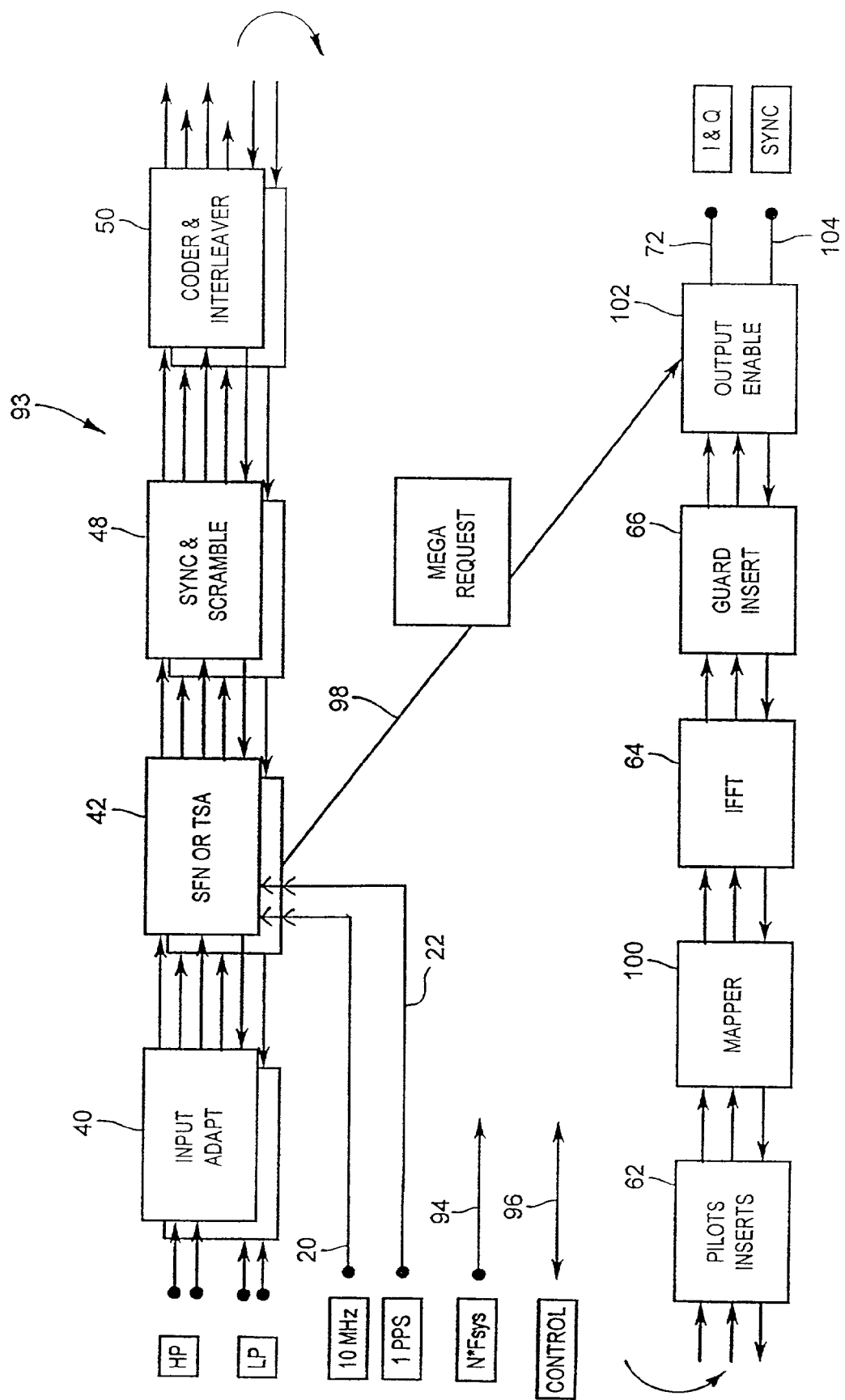
FIG. 4 is a simplified block diagram of a COFDM (Coded Orthogonal Frequency Division Multiplexing) modulator.

In one embodiment and referring to FIG. 4, COFDM (Coded Orthogonal Frequency Division Multiplexing) modulator 93 calculates the envelope of the signal and converts signals from the time domain into the frequency domain. COFDM coder module 93 replaces components having common reference designations between FIGS. 2 and 4. These components have similar functions in these two figures. However, hierarchical mode uses two identical channels as indicated by the duplication of blocks 40, 42, 48, and 50 in FIG. 4. In addition, some of the blocks in FIG. 4 have additional functions that are described below. In the embodiment represented in FIG. 4, each block is connected to a clock (N*Fsys) 94 and to control 96. Data input and output is synchronous to N*Fsys.

The basic requirements for SFN timing is to (1) find MIP (Megaframe Information Package) that holds information about Megaframe ID and time; (2) identify a Megaframe in a signal; and (3) assure that the megaframe after all the processing is output at a specified time. An SFN delay module supplies all of the required delay and identifies the megaframe by supplying a "megaframe sync" following the first data item in a megaframe. The delay module creates a feed-forward signal used to open the output stream when synchronized to an SFN signal. (This function is initialization of the SFN operation.) When initialized, the feed-forward signal and the megasync output signal continue to be aligned because the total SFN system is fully synchronous.

Because of strict timing requirements for SFN, a system designed for SFN operation can use the same timing for most circuits in MFN timing. More particularly, except for timing requirements, blocks from a sync inverter and the rest of the instrument have no special SFN/MFN requirements. In one embodiment, MFN timing attempts to simulate an SFN system at the input of the sync inverter, thereby making the most of the blocks independent of MFN/SFN mode.

COFDM coder module 93 includes an input adapter 40. Input adapter 40 accepts inputs of eight data lines, a clock line, a data valid line, and a sync line, although the use of sync line is optional. Outputs of input adapter 40 include eight data lines, a clock line, a data valid line, and a sync line. Input adapter 40 also provides information to a controller, including a sync locked indicator and a indicator of packet size (i.e., whether the received packet size is 188 or 204 bytes), which is detected by automatic synchronizing with the input data. Input adapter 40 provides a flexible input to enable different electrical interfaces, and accepts jitter from transmission including ASI in burst mode. Output data rates for COFDM coder module 93 range from 450 kbytes/sec to 4.5 MB/sec. Data output from input adapter 40 is a predefined function when no data is input and, in this embodiment, is always converted to 204 byte packets at the output regardless of the received packet size.

Transport stream inputs can have clock jitter from different parts of the distribution network, and is attenuated when it is above a predetermined frequency to assure proper operation of the TSA network.

Transport stream adapter 42 of FIG. 4 includes a rate adaptation module (not separately illustrated) that accepts outputs of input adapter 40 as inputs. In addition, there is a reference input 94 having a frequency of N×Fsys, where Fsys is the system clock frequency. The rate adaptation module provides eight data lines of output, one data enable line, one sync line, and one "megasync" line 98. The output, in one embodiment, has a packet size of 204 bytes (which includes 16 dummy bytes when Reed-Solomon coding is not used). The sync output follows the first data byte in a packet, whereas megasync output 98 follows the first data byte in each "megaframe." In one embodiment (MFN, or Multiple Frequency Network), the first megaframe is selected at random, and is used only to simulate the same output as SFN uses at this interface. The actual output rate is controlled by an "enable" input from a data receiver. The number of packets in a megaframe is used for megasync generation, and to force the insert of stuffing into the data stream.

In one embodiment, the rate adaptation module of transport stream adapter 42 calculates a data rate from the mode, where there is a different rate for 6, 7, and 8 MHz. Also in one embodiment, stuffing packets that are received are deleted, and stuffing packets are delivered when no input packets are ready. Thus, the rate adaptation module is functional even if its input rate is zero. When the data rate is changed in a transport stream, the PCR (Program Clock Reference) packets are restamped according to their packet position in the stream.

The output of the rate adaptation module is input to an SFN delay module (which, in one embodiment, is bypassed in MFN). (The SFN delay module is part of transport stream adapter 42 and is not separately shown in FIG. 4.) The input is arranged as 204 byte packets, with 16 dummy bytes when RS encoding is not used. A reference input 94 is also provided at a frequency of N×Fsys, as a system clock. In one embodiment, all SFN timing is in 100 nsec resolution with reference to this signal. A 1 pps (pulse per second) reference signal 22 is also provided for megaframe output timing. The output of the SFN delay module includes eight data lines, one data enable line, one sync line, and one megasync line 98. The output is arranged in 204 byte packets with RS encoded bytes, with a sync output following the first data byte in a packet. In addition, a megasync output follows the first data byte in each megaframe. An addition "mega request" output 98 is provided as a feed-forward signal to enable/synchronize megaframe output with exact timing.

The number of packets in a megaframe can be used for acceptance of a single missing MIP. A time offset (i.e., a programmable offset from MIP defined) is used to compensate for transmitter delay. In one embodiment, SFN delay module is forced to insert stuffing bytes under conditions of no input, and information fields are output from MIP frames.

The SFN delay module operates as a FIFO (first in, first out register), providing up to 1 second of delay. The SFN delay module also extracts timing information to generate megarequest signal 98.

The output of SFN delay module is provided to a sync inverter module (not separately shown in FIG. 4, but which is a part of scrambler 48 in the embodiment represented therein). The Sync inverter module inverts all of the bits in every eighth packet, and passes this data to a scrambler module (also not separately shown, but part of scrambler 48). The scrambler module synchronizes to the eight packet sequence produced by sync the inverter module and adds a PRBS (Pseudo-Random Binary Sequence) to the signal.

The output of scrambler 48 is arranged as 204 byte packets including 188 data bytes and 16 dummy bytes. This input is provided to a Reed Solomon encoder 50, which replaces the 16 dummy bytes with a Reed-Solomon checksum. An outer interleaver (not separately shown, but part of Reed Solomon encoder 50 in the embodiment of FIG. 4) operates on the Reed-Solomon encoded packets to produce interleaved output. A megasync output follows the first data byte in each megaframe as data leaves the outer interleaver, and interleaving is provided. An inner coder module (not shown, but part of Reed Solomon encoder 50 in the embodiment of FIG. 4) has eight lines of input data, one data enable input, and one megasync indicator line, and produces output data on two, four, or six data output lines. The number of lines used for data output is dependent upon a selected mode of operation. A data enable line and a megasync line are also output. A megasync output follows the first data in each megaframe. In hierarchical mode, the megasync output is the last part of the two independent input channels. A code rate control and a mode control (to select two, four, or six bit mode) are also input to the inner coder module, which implements a punctured convolutional coder initialized using a signal on megasync line.

The six data lines, data enable line, and two megasync lines from code rate control are input to a bit interleaver module (not separately shown, but part of Reed-Solomon encoder 50 in the embodiment of FIG. 4). The data input to the bit interleaver module depends upon the data constellation and the hierarchical mode. For example, depending upon which non-hierarchical mode is operational, either two, four, or six data lines are active and input from an HP (High Priority) bit stream channel. In a hierarchical mode, there is only one megasync from each channel, and input data is two bits from one channel and either two or four bits from the other channel. The bit interleaver module provides outputs on two, four, or six data lines, depending upon mode. Bit interleaver module also provides one data enable line and one megasync line. Bit interleaver module operates as up to as many as six independent interleavers. By taking input from two channels, this module also serves as a combining point for hierarchical mode. An interleaving depth of 126 bits is provided in one embodiment.

A byte interleaver module (not separately shown, but part of Reed Solomon encoder 50 in the embodiment of FIG. 4) operates on the output of the bit interleaver module. More specifically, six data lines, one enable line, and one megasync line provide inputs for the byte interleaver module, although only two or four of the six data lines are active in some modes. Correspondingly, the same number of the six data line outputs are active. The byte interleaver module also provides a data enable line output, a sync output, and a megasync output line. The byte interleaver module generates blocks of data, where one block fits into one IFFT block, by interleaving in a block size equal to the data capacity of one IFFT symbol. In one embodiment, the byte interleaver module operates by writing data in an address pattern, and then reading linearly, so that interleaving is done in one symbol. The next symbol works in the opposite direction so that the reading address of one symbol is used as the writing address of the next symbol in the same memory. The memory of byte the interleaver module in one embodiment is 6048 six-bit words.

Pilot inserter module 62 receives six data lines from the byte interleaver module of Reed-Solomon encoder 50, a data enable line, a sync line, and a megasync line. (In some modes, only two or four of the six data lines are active.) In addition, for TPS (Transmission Parameter Signaling) modulation, pilot inserter module 62 receives control information 96 to determine a mode of operation. The output of pilot inserter module 62 is a stream of complex data represented as constellation indices. More particularly, in one embodiment, two four-bit data lines are output. A data enable line is also provided as output, as is a sync line and a megasync line. These outputs of pilot inserter module 62 are provided as inputs to mapper module 100. Mapper module 100 receives the stream of complex data represented by constellation indices and converts this stream into a stream of complex data represented as two words, which, in one embodiment, are sixteen bits each. A control input 96 of mapper module 100 determines a type of constellation. In one embodiment, selectable constellation types are QPSK (Quaternary Phase Shift Keyed), 16-QAM (Quadrature Amplitude Modulated) non-hierarchical (or hierarchical and $\alpha=1$), 64-QAM non-hierarchical (or hierarchical and $\alpha=1$), 16-QAM hierarchical $\alpha=2$, 16-QAM hierarchical $\alpha=4$, 64-QAM hierarchical $\alpha=2$, and 64-QAM hierarchical $\alpha=4$. Mapper module 100 translates each input from index to actual modulation amplitude. In one embodiment in which the mapper function is implemented in an IFFT chip, an optional bypass control is provided for mapper module 100.

IFFT module 64, which in one embodiment is a single chip module, inputs blocks of 8K or 2K complex data through a 16-bit parallel interface from mapper module 100. IFFT module 64 produces corresponding blocks of 8K or 2K complex data at 16-bit interface. The input and output are both 16-bit parallel interfaces in the same format. IFFT 64 also has control inputs including an FFT (Fast Fourier Transform) size selection, an IFFT/FFT selection, and a scale control. In one embodiment, support is provided for 4K (Japanese OFDM), and 1K, 512, 256, and 64 (Wireless LAN) blocks of complex data.

Guard interval insertion module 66 receives blocks of 8K or 2K complex data from IFFT module 64 through a 16-bit parallel interface. Guard interval insertion module 66 processes this data and outputs blocks of 8K or 2K complex data (depending upon which is input) plus a guard interval length. A sync signal is active during the guard interval. The guard interval is selectable from a plurality of values depending upon a state of control 96. In one embodiment, for example, the guard intervals are selected from ¼, ⅛, 1/16 and 1/32. The guard interval is a copy of the last part of the IFFT-result, and is inserted before the main part. The output of guard interval insertion module 66 is applied to an output enable switch 102, which is used to create an exact timed output condition when starting an SFN transmission. Output enable switch 102 receives a continuous I & Q base band stream sampled at Fsys. A resync signal is also input. This signal causes output enable switch 102 to restart an SFN synchronization sequence by outputting data until a megasync is received, and stopping output until a megasync out request is received. Output enable switch 102 produces I & Q base band outputs 72, a symbol sync output 104, a delayed sync output, and a request data output. Symbol sync output 104 is active during guard band data, and inactive during non-guard band data. The delayed sync output is presented to an external connector for measurement purposes. Two bits are provided, one of which is a symbol sync, which is active during a guard interval, and the other is a megasync, which is active during a guard interval of a first symbol in a megaframe. In one embodiment, the outputs of output enable switch 102 are delayed by a programmable amount to compensate for other instrument delays. The request data output is used to indicate a data request to a preceding functional block.

Functionally, modulator 93 is a single-board Dvb-T modulator that can be used in a variety of applications. For example, it can be used in a unit having a U base cabinet with reference design and IF/UHF circuits, or it can be customized for specific transmitters. One embodiment of modulator 92 is in VHDL (VHSIC [very high speed integrated circuit] Hardware Description Language), so that it can be programmed into a single FPGA (Field Programmable Gate Array) or an ASIC (Application-Specific Integrated Circuit). Depending upon the embodiment, some external memory may be required.

In operation, one embodiment of the present invention includes instrument control via a front panel, a remote control, and via an MIP frame in an SFN transport stream. An additional remote interface is also provided for precorrector on-line correction, and control from transport stream disconnect is possible. Also provided is a front panel setting menus lock, automatic memory for restart with correct settings after power off, three or more memories for instrument settings, and separate memories for precorrector settings. A clock reference input and a time reference input are provided. An input indicator provides indications of data present, clock recovered (for serial input), input data overflow/underflow, sync 188 byte present, sync 204 byte present, MIP present (for SFN signals) and input data rate. Supported modes are 2K or 8K IFFT, guard intervals of ¼, ⅛, 1/16, 1/32, and code rates of ½, ⅔, ¾, ⅚, and ⅞ (independent for LP and HP). Constellations provided are QPSK, 16-QAM, and 64-QAM. Mapping is uniform (alpha=1), alpha=2, and alpha=4. Full support is provided for hierarchical mode. All SFN input bit rates are supported, as well as MFN bit rates according to selected mode, +0%/−20%. No input generates defined internal signal: zero-frames. Supported bandwidths are 8 MHz, 7 MHz, and 6 MHz.

Signal delay is compatible with SFN, with a maximum delay up to 999 msec, and minimum delay of 50 msec (implementation delay). Full I & Q amplitude and phase correction is provided, and linearity precorrection is programmable. Three or more settings are stored in a nonvolatile memory. Transport stream is substituted by zero-frames if there is no input, and muting RF/IF output is selectable. Test signals provided are removed carriers (selectable position and width, to test IM noise, etc.), single carrier (center frequency) RMS level like normal signal (converter alignment, phase noise), an internal $2^{23}-1$ PRBS, other PRBS sequences, three insertion points for PRBS, and zero-frames.

Figure 5:
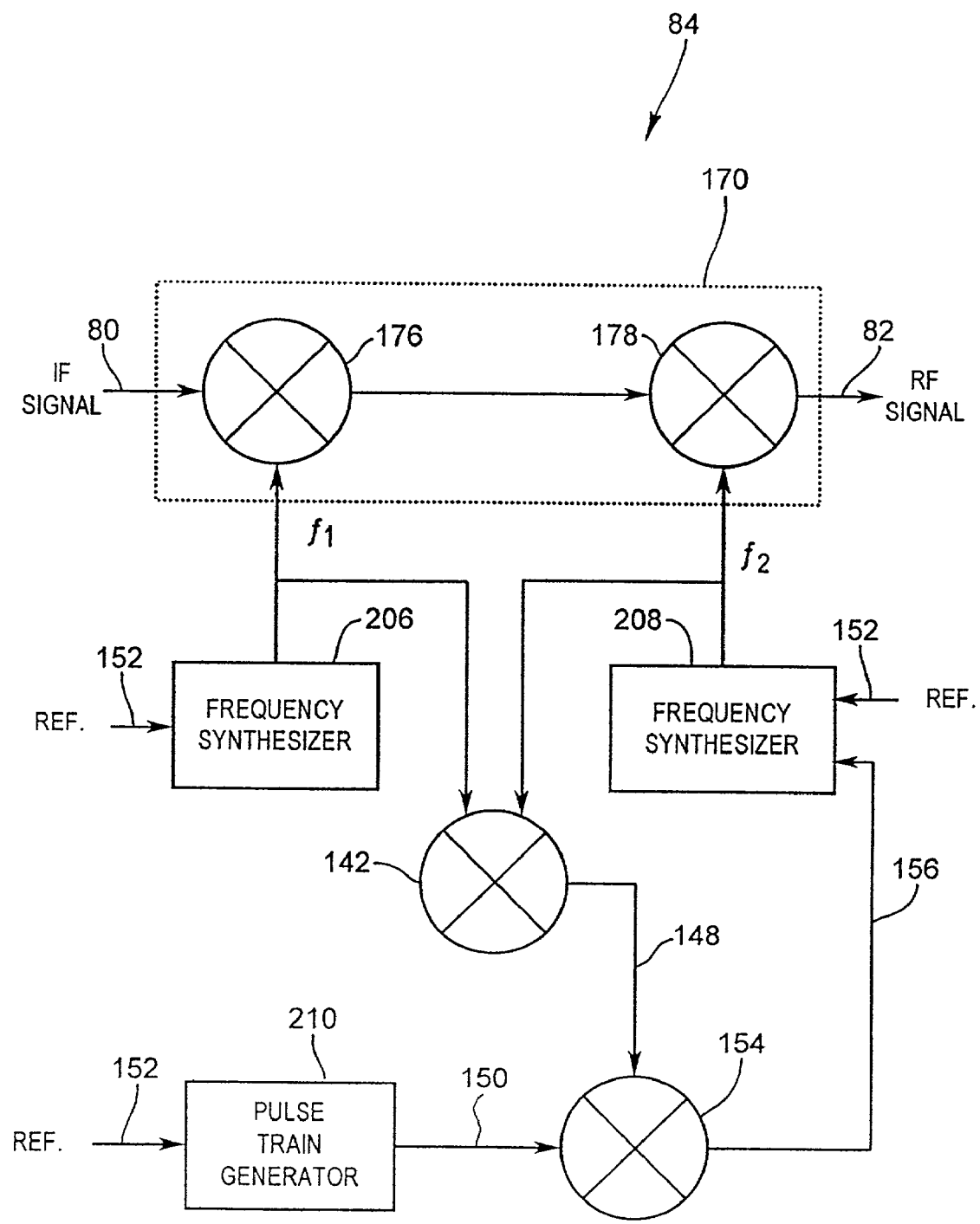
FIG. 5 is a simplified block diagram of one embodiment of an RF converter circuit of the present invention.

In one embodiment and referring to FIG. 5, low phase noise and high frequency resolution is achieved by RF converter 84. The RF converter includes a first frequency synthesizer 206, a second frequency synthesizer 208, a first mixer 176, a second mixer 178, a difference mixer 142, a sampling mixer 154 and a pulse train generator 210. An IF signal 80 from the IF output amplifier 78 (FIG. 2) is input into signal path 170. The signal path 170 includes the first and second mixers 176, 178 and outputs the RF signal 82. The first mixer 176 receives a signal from the first frequency synthesizer 206 at frequency $f_1$ and the second mixer 178 receives a signal from the second frequency synthesizer 208 at frequency $f_2$. The signals from the first frequency synthesizer 206 and the second frequency synthesizer 208 are also input into the difference mixer 142. The output of the difference mixer 142 is connected to the sampling mixer 154. Also connected to the sampling mixer 154 is the pulse train generator 210. The output of the sampling mixer 154 is an error signal 156 that is provided to the second frequency synthesizer 208. The first frequency synthesizer 206, the second frequency synthesizer 208 and the pulse train generator 210 each receive a reference signal 152 as an input.

In operation, the RF converter 84 shifts the frequency of the IF signal 80 to produce the RF signal 82. The shift in the frequency of the IF signal 80 occurs through the signal path 170 wherein the first mixer 176 causes the IF signal 80 to be shifted upwards by $f_1$ and the second mixer 178 causes the signal from the first mixer 176 to be shifted downwards by $f_2$. The RF signal 82 is therefore the IF signal 80 shifted in frequency by $f_1-f_2$. The signals $f_1$ and $f_2$ are created by the first frequency synthesizer 206 and the second frequency synthesizer 208, respectively. The frequency synthesizers 206, 208 are programmed such that the difference between their respective frequencies is the desired frequency shift in the IF signal 80.

The accuracy of the frequency shift is maintained through a sampling circuit that measures the frequency shift and generates an error signal 156 that causes the second frequency synthesizer 208 to adjust its signal $f_2$. The signals $f_1$ and $f_2$ are input into the difference mixer 142, which outputs a difference signal 148 at the frequency $f_2-f_1$. This signal is input into the sampling mixer 154. Also input into the sampling mixer 154 is a low-frequency reference signal 150 generated by the pulse train generator 210. The low-frequency reference signal 150 is a clean, synthesized low-frequency reference signal that has an Nth order harmonic at a frequency corresponding to the desired frequency shift in the IF signal 80. The low-frequency reference signal 150 is a train of delta pulses.

The sampling mixer 154 receives the low-frequency reference signal 150 and the difference signal 148 and generates an error signal 156. The combination of the pulse train reference signal 150, having an Nth order harmonic at the desired frequency shift, and the difference signal 148 results, through aliasing, in an error signal 156 with a low frequency component representative of the difference between the desired frequency shift and the actual frequency shift. The error signal 156 is provided to the second frequency synthesizer 208, which adapts the frequency $f_2$ accordingly to minimize the error signal.

The comparison of the actual frequency shift with a reference signal using a harmonic of the reference signal and the aliasing effects of sampling results in less phase noise because it constitutes a purely mathematical operation, whereas a comparison of the frequency shift with a reference signal using a division circuit introduces significant phase noise due to the circuitry involved in the divider. By eliminating the divider phase noise, the overall performance of the circuit is improved.

Figure 6:
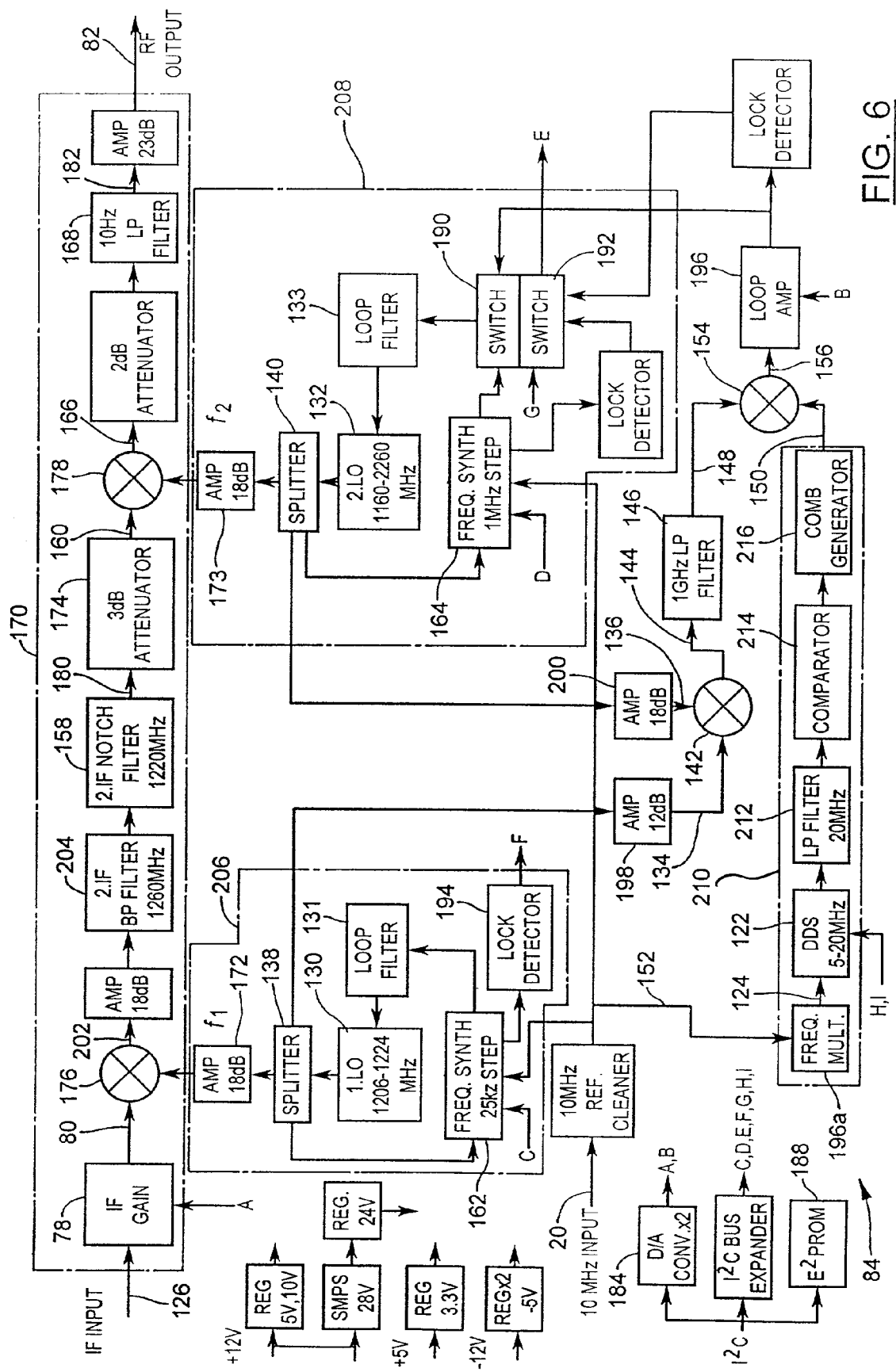
FIG. 6 is a simplified block diagram of one embodiment of an RF converter circuit of the present invention.

FIG. 6 shows in greater detail a block diagram of one embodiment of the RF converter 84. In the embodiment shown in FIG. 6, a direct digital synthesis (DDS) circuit 122 supplied with a clock signal 124, derived from a crystal oscillator and frequency multiplier 196a, is used to produce a clean, agile frequency reference. DDS circuit 122, for example, is a combination of a numerically controlled oscillator (NCO), a multiplier, a D/A converter and a comparator. DDS circuit 122 is a used for generation of a clock signal with a programmable frequency. In one embodiment, the operating frequency of DDS circuit 122 is programmed to be an integer fraction of the difference between the two local oscillators 130 and 132, i.e., $(f_2-f_1)/N$, where N is chosen so that DDS circuit 122 output frequency is the highest possible frequency below 20 MHz.

The upward change in frequency between IF signal 126 and RF signal 82 is determined by the frequency difference between two synthesized local oscillators 130 and 132. In one embodiment, the frequency range of local oscillator 130 adapts different IF frequencies from 36 to 54 MHz to 1260 MHz bandpass filter 204. Also in one embodiment, the frequency range of local oscillator 132 is determined by a desired output frequency from −100 MHz to +1000 MHz, so that in the range 0–100 MHz, the converter is capable of delivering inverted and non-inverted spectrum output.

Samples 134, 136 of the signals from oscillators 130 and 132 split off using splitters 138 and 140, respectively, are compared using mixer 142. (In one embodiment, mixer 142 is fed with different signal levels provided by amplifiers 198 and 200 because one signal is connected to an LO port of mixer 142 and the other to an RF port of mixer 142.) Output 144 of mixer 142 is low-pass filtered 146 to obtain a compared difference frequency signal 148 between oscillators 130 and 132. This difference frequency is compared with a harmonic of a clean, synthesized, harmonically generated low-frequency reference signal 150 derived from reference signal 152, which itself is used to as a reference for oscillators 130 and 132. The comparison between reference signal 152 and difference signal 148 utilizes a sample detector or mixer 154. Error signal 156 is amplified and applied as a correction to oscillator 132.

A frequency setting is initiated by programming two ordinary frequency synthesizers 162, 164 to a frequency close to a desired frequency, within step size limitations. When lock is achieved, switches 190 and 192 are used to substitute synthesizer 164 with a control voltage from sample detector amplifier 198. Provided that the frequency difference between the first frequency setting and the final determined by DDS 122 is smaller than the lock-in range for the sample detector loop, oscillator 164 will adjust so that the frequency difference $f_2-f_1=N*f_{DDS}$. Thus, the step sizes of frequency synthesizers 162 and 164 can be selected for practical reasons, as they have no influence on the final frequency resolution, which is determined solely by N times the DDS 122 step size. In one embodiment, this frequency resolution can be in the milli- or microHertz range.

The relationship between synthesized reference signal 150 and low frequency reference ensures that the divider phase noise of traditional prescalers is essentially eliminated, while the use of an internal reference frequency generated by DDS122 provides enhanced frequency resolution as the DDS is capable of very fine frequency stepping.

IF output 80 of IF amplifier 78 is mixed with the output frequency $f_1$ of first oscillator 130, which in one embodiment is a frequency between 1206 and 1224 MHz that is adjustable in 25 kHz steps 162. Upconverted signal 202 centered at about 1260 MHz and is sent through a band pass filter 204 and a notch filter 158 to remove unwanted mixing products and to limit signal bandwidth. In one embodiment, the bandwidth of band pass filter 204, is 20 MHz to assure flat amplitude and group delay response within an OFDM channel bandwidth (8 MHz). Notch filter 158 is provided to suppress leakage from local oscillator 130.

A further conversion takes place when filtered, upconverted signal 160 is mixed with output frequency $f_2$ of second oscillator 132, which in one embodiment ranges between 1160 and 2260 MHz in 1 MHz steps 164. The resulting output signal 166 is passed through low pass filter 168 to remove unwanted mixing products and to produce an RF DTV signal 82 in the VHF or UHF band.

More particularly, if IF output 80 is characterized by an IF frequency $f_{IF}$, the frequency of RF DTV signal 82 is $f_{RF}=(f_2-f_1)-f_{IF}$. The use of small frequency steps for first oscillator 130 and larger frequency steps for second oscillator 132 achieves a wide output frequency range at high frequency resolution. Low phase noise is achieved because the frequency difference $(f_2-f_1)$ is compared with a signal 150 derived from a clean version 152 of external reference 20 and the phase difference is used as feedback for the second oscillator 132.

The choice of a smaller frequency range and step size for first oscillator 130 compared with that of second oscillator 132 makes it more convenient to design filters 204 and 158 for a specified IF frequency $f_{IF}$, but these relationships are not required in all embodiments. Embodiments having different filtering configurations for signal path 170 can be designed so that the frequency of RF DTV signal 82 is $f_{RF}=|(f_1-f_2)-f_{IF}|$ rather than $f_{RF}=|(f_2-f_1)-f_{IF}|$. However, the design choices illustrated in the embodiment of FIG. 9 simplify tuning of RF converter 84 and the design of signal path 170.

Amplifiers and attenuators such as 172, 174 and others not specifically numbered are provided in RF converter 84 to optimize signal levels in the circuit in one embodiment. Such circuit optimizations are considered to be within the capability of one of ordinary skill in the art upon achieving an understanding of the present invention.

In another embodiment of RF converter 84, phase difference error signal 156 is fed back to first oscillator 130 rather than second oscillator 132. Because the total frequency conversion is based on the frequency difference ($f_2-f_1$), this embodiment also achieves reduction of phase noise from RF output signal 82.

In another embodiment, RF converter 84 is configured as a downconverter stage for a DTV receiver. In this case, signal 126 is or is derived from a received RF signal. IF amplifier 78 is eliminated or optionally replaced by a suitable RF amplifier. Filters in signal path 170 select mixing products from mixers 176 and 178 so that output 82 of signal path 170 is a baseband or an IF signal, where either $f_{IF}=|(f_1-f_2)-f_{RF}|$ or $f_{IF}=|(f_2-f_1)-f_{RF}|$, depending upon a design choice implemented by the filtering.

In one specific transmitter embodiment, RF converter 84 accepts an IF input signal 126 characterized by an IF frequency between 36 and 54 MHz. For example, let us assume IF input signal 126 is characterized by a 46 MHz IF frequency, first oscillator 130 is set by frequency synthesis to a frequency of 1210.025 MHz and second oscillator 132 is set by frequency synthesis to a frequency of 1950 MHz. The first mixing product 180 (which is selected by filtering) is the mixing product at 1256.025 MHz. The second mixing product 182 selected by low pass filter 168 is 693.975 MHz, which is the frequency of RF output signal 82. In this example, $f_{RF}=|(f_2-f_1)-f_{IF}|$, where $f_{IF}=46$ MHz, $f_1=1210.025$ MHz, and $f_2=1950$ MHz.

Other features of the embodiment illustrated in FIG. 6 include two D/A converters (shown as 184) controlling IF gain (A) and loop gain(B), a PC bus expander 186, which is an I²C bus device with 8 logic outputs, and EEPROM 188, which is a memory for calibration data, for example, gain and frequency dependency. Modules 78, 122, 162, 164, 184, 186, 188, 190, 192, 194, 196, and 198 are controllable via remote control.

In one receiver embodiment, the input signal to signal path 170 is an RF signal rather than an IF signal, the output signal is an IF signal, and RF signal is first mixed with a wide-range, coarse tuning oscillator followed by a narrow-range, fine-tuning oscillator. (In other words, the positions of oscillators 130 and 132, as well as their synthesizer inputs 162, 164, and other associated components and correction inputs are exchanged.) An RF input signal at 693.975 MHz, for example, is first mixed with a 1950 MHz signal to obtain a mixing product at 1256.025 MHz, which is band-pass filtered. This product is then down-converted with a 1210.025 MHz local oscillator signal to product a 46 MHz IF signal. In this example, $f_{RF}=693.975$ MHz, $f_1=1210.025$ MHz, and $f_2=1950$ MHz., and $f_{IF}=|(f_2-f_1)-f_{RF}|$.

Figure 7:
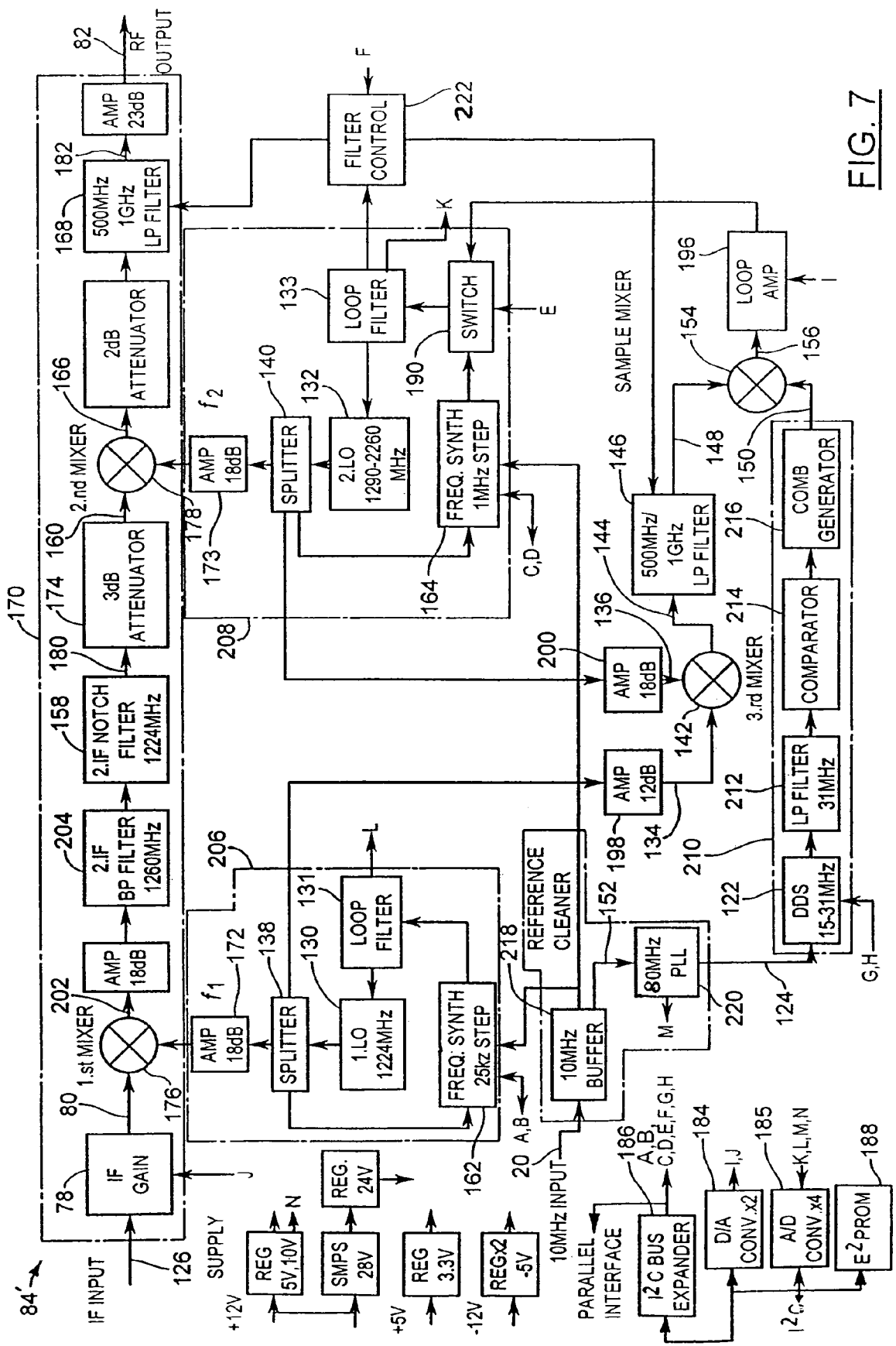
FIG. 7 is a simplified block diagram of an alternative embodiment of an RF converter circuit of the present invention.

Reference is now made to FIG. 7, which shows a block diagram of an RF converter 84', which is an alternative embodiment of the RF converter 84 of FIG. 5. Like reference numerals in the Figures correspond to like components. The RF converter 84' shown in FIG. 7 functions similar to that shown in FIG. 6 except for differences that will be apparent from the following description. It will be noted that the alphabetic control signal designations vary and are not identical between FIG. 6 and FIG. 7.

In the RF converter of 84', the first frequency synthesizer 206 includes a frequency synthesizer 162, a local oscillator 130, a splitter 138, a loop filter 131 and an amplifier 172. The reference signal 152 and control signal B are input into the frequency synthesizer 162. The output of the frequency synthesizer 162 is connected to the local oscillator 130 through the loop filter 131. The local oscillator 130 outputs a signal which passes through the splitter 138. The splitter 138 has three outputs. One of the outputs from the splitter 138 is connected to the frequency synthesizer 162 to establish a feed back loop. Another output of the splitter is connected to the difference mixer 142 through an amplifier 198. The third output from the splitter 138 is connected to the amplifier 172, which produces the signal $f_1$ that is provided to the first mixer 176.

The second frequency synthesizer 208 includes a frequency synthesizer 164, a local oscillator 132, a splitter 140, a loop filter 133, an amplifier 173 and a switch 190. The reference signal 152 and control signal D are input into the frequency synthesizer 164. The output of the frequency synthesizer 164 is connected to the local oscillator 132 through the switch 190 and the loop filter 133. The local oscillator 132 outputs a signal which passes through the splitter 140. In a similar fashion as to the first frequency synthesizer 206, the outputs of the splitter 140 are connected to the difference mixer 142, the frequency synthesizer 164 and to the second mixer 178. The switch 190 receives the error signal 156 and a control signal E. The switch 190 selects whether the local oscillator 132 receives a signal from the frequency synthesizer 164 or the error signal 156.

The upward change in frequency between IF signal 126 and RF signal 82 is determined by the frequency difference between the two synthesized local oscillators 130 and 132. In one embodiment, the frequency range of local oscillator 130 adapts different IF frequencies from 36 to 44 MHz up to 1260 MHz. Also in one embodiment, the frequency range of local oscillator 132 is determined by a desired output frequency from 30 MHz to 1000 MHz. Accordingly, the frequency range of local oscillator 132 is 1290 MHz to 2260 MHz, which therefore adapts the 1260 MHz signal from the first mixer 176 to 30 MHz to 1000 MHz.

Samples 134,136 of the signals from oscillators 130 and 132 split off using splitters 138 and 140, respectively, are compared using the difference mixer 142. (In one embodiment, the difference mixer 142 is fed with different signal levels provided by amplifiers 198 and 200 because one signal is connected to an LO port of the difference mixer 142 and the other to an RF port of the difference mixer 142.) An output 144 of the difference mixer 142 is low-pass filtered 146 to obtain the difference frequency signal 148 between the oscillators 130 and 132. This difference frequency signal 148 is compared with a harmonic of the clean, synthesized, low-frequency reference signal 150 derived from the reference signal 152, which itself is used to as a reference for the oscillators 130 and 132. The comparison between the low-frequency reference signal 150 and the difference signal 148 occurs using the sample mixer 154. Error signal 156 is amplified through an amplifier 196 and applied as a correction signal to oscillator 132.

Referring still to FIG. 7, the pulse train generator 210 is implemented using a direct digital synthesis (DDS) circuit 122 supplied with a clock signal 124 to produce a clean, agile frequency reference. DDS circuit 122, for example, is a combination of a numerically controlled oscillator (NCO), a multiplier, a D/A converter and a comparator DDS circuit 122 is used for generation of a clock signal with a programmable frequency. In one embodiment, the operating frequency of DDS circuit 122 is programmed to be an integer fraction of the difference between the two local oscillators 130 and 132, i.e., $(f_2-f_1)/N$, where N is chosen so that DDS circuit 122 output frequency is the highest possible frequency below 30 MHz. In other words, the difference between the two local oscillators' 130, 132 frequencies corresponds to the Nth order harmonic of the operating frequency of the DDS circuit 122.

The pulse train generator 210 is further implemented using a low pass filter 212, a comparator 214 and a comb generator 216. The low pass filter 212 filters out aliasing products from the DDS circuit 122 to create a clear sinusoidal signal. The comparator 214 clips the sinusoidal signal from the DDS circuit 122 to a square wave. The comb generator 216 then converts the square wave to a train of delta pulses synchronized to the leading edges of the square wave. The resulting low-frequency reference signal 150 is a clean, synthesized low-frequency pulse train reference signal that has an Nth order harmonic at a frequency corresponding to the desired frequency shift in the IF signal 80.

The pulse train generator 210 is supplied with a clock signal 124 derived from an external 10 MHz reference signal 20. The external reference signal 20 is buffered 218 and then the buffered reference signal 152 is input into the frequency synthesizers 162, 164 and an 80 MHz PLL 220. The 80 MHz PLL 220 is an 80 MHz crystal locked to the 8th order harmonic of the 10 MHz reference. The loop bandwidth is very low, so phase noise from the external reference signal 20 is suppressed. The 80 MHz PLL 220 provides the 80 MHz clock signal 124 used by the DDS circuit 122.

In operation, a frequency setting is initiated by programming the two frequency synthesizers 162, 164, using control signals C and D, to a frequency close to a desired frequency, within step size limitations. When lock is achieved, switch 190 is used to substitute synthesizer 164 with the error signal 156 from amplifier 198. Provided that the frequency difference between the first frequency setting and the final determined by DDS circuit 122 is smaller than the lock-in range for the sample detector loop, oscillator 132 will adjust so that the frequency difference $f_2-f_1=N*f_{DDS}$. Thus, the step sizes of frequency synthesizers 162 and 164 can be selected for practical reasons, as they have no influence on the final frequency resolution, which is determined solely by N times the DDS circuit 122 step size. In one embodiment, this frequency resolution can be in the milli- or microHertz range.

Referring still to FIG. 7, the signal path 170 includes the first and second mixers 176, 178, the IF amplifier 78, a bandpass filter 204, a notch filter 158, a low pass filter 168 and various amplifiers and attenuators, as required. The IF output 80 of the IF amplifier 78 is mixed with the output signal $f_1$ of the first local oscillator 130, which in one embodiment is a frequency between 1216 and 1224 MHz that is adjustable in 25 kHz steps 162. Upconverted signal 202 centered at about 1260 MHz is sent through the band pass filter 204 and the notch filter 158 to remove unwanted mixing products and to limit signal bandwidth. In one embodiment, the bandwidth of band pass filter 204, is 20 MHz to assure flat amplitude and group delay response within an OFDM channel bandwidth (8 MHz). Notch filter 158 is provided to prevent leakage from the first local oscillator 130.

A further conversion takes place when filtered, upconverted signal 160 is mixed with output signal $f_2$ of the second local oscillator 132, which in one embodiment ranges between 1290 and 2260 MHz in 1 MHz steps 164. The resulting output signal 166 is passed through low pass filter 168 to remove unwanted mixing products and to produce an RF DTV signal 82 in the VHF or UHF band.

More particularly, if IF output 80 is characterized by an IF frequency $f_{IF}$, the frequency of RF DTV signal 82 is $f_{RF}=(f_2-f_1)-f_{IF}$. The use of small frequency steps for first oscillator 130 and larger frequency steps for second oscillator 132 achieves a wide output frequency range at high frequency resolution. Low phase noise is achieved because the frequency difference $(f_2-f_1)$ is compared with a low-frequency pulse train reference signal 150 derived from a clean reference signal 152 and the phase difference is used as feedback for the second oscillator 132.

The choice of a smaller frequency range and step size for first oscillator 130 compared with that of second oscillator 132 makes it more convenient to design filters 204 and 158 for a specified IF frequency $f_{IF}$, but these relationships are not required in all embodiments. Embodiments having different filtering configurations for signal path 170 can be designed so that the frequency of RF DTV signal 82 is $f_{RF}=|(f_1-f_2)-f_{IF}|$ rather than $f_{RF}=|(f_2-f_1)-f_{IF}|$. However, the design choices illustrated in the embodiment of FIG. 7 simplify tuning of RF converter 84' and the design of signal path 170. It will be understood that at least one of the oscillators 130, 132 is required to have a step size that allows the frequency difference to fall within the pulling range of the low-frequency reference signal 150.

Amplifiers and attenuators such as 172, 174 and others not specifically numbered are provided in RF converter 84 (and RF converter 84') to optimize signal levels in the circuit in one embodiment. Such circuit optimizations are considered to be within the capability of one of ordinary skill in the art upon achieving an understanding of the present invention.

Low pass filters 168, 146 are controlled by a filter control 222 that receives a control signal F. The filter control 222 can select a bandwidth of 500 MHz or 1 GHz for the low pass filters 168, 146. When the RF signal 82 is a lower frequency signal, i.e., less than 500 MHz, the filter control 222 will select a 500 MHz bandwidth for the low pass filters 168, 146.

In another embodiment of RF converter 84 (and RF converter 84'), phase difference error signal 156 is fed back to first oscillator 130 rather than second oscillator 132. Because the total frequency conversion is based on the frequency difference $(f_2-f_1)$, this embodiment also achieves reduction of phase noise from RF output signal 82.

In one specific transmitter embodiment, RF converter 84 (and RF converter 84') accepts an IF input signal 126 characterized by an IF frequency between 36 and 54 MHz. For example, let us assume IF input signal 126 is characterized by a 46 MHz IF frequency, first oscillator 130 is set by frequency synthesis to a frequency of 1210.025 MHz and second oscillator 132 is set by frequency synthesis to a frequency of 1950 MHz. The first mixing product 180 (which is selected by filtering) is the mixing product at 1256.025 MHz. The second mixing product 182 selected by low pass filter 168 is 693.975 MHz, which is the frequency of RF output signal 82. In this example, $f_{RF}=|(f_2-f_1)-f_{IF}|$, where $f_{IF}=46$ MHz, $f_1=1210.025$ MHz, and $f_2=1950$ MHz.

Other features of the embodiment illustrated in FIG. 7 include two D/A converters 184 generating control signals A and B for controlling IF gain and loop gain, four A/D converters 185 receiving control signals K, L, M and N to supervise voltages in the oscillator loops and the 10V supply, a PC bus expander 186, which is an $I^2C$ bus device with 8 logic outputs, and EEPROM 188, which is a memory for calibration data, for example, gain and frequency dependency. Modules 78, 122, 131, 133, 162, 164, 184, 185, 186, 188, 190, 196 and 222 are controllable via remote control.

In one receiver embodiment, the input signal to signal path 170 is an RF signal rather than an IF signal, the output signal is an IF signal, and RF signal is first mixed with a wide-range, coarse tuning oscillator followed by a narrow-range, fine-tuning oscillator. (In other words, the positions of oscillators 130 and 132, as well as their synthesizer inputs 162, 164, and other associated components and correction inputs are exchanged.) An RF input signal at 693.975 MHz, for example, is first mixed with a 1950 MHz signal to obtain a mixing product at 1256.025 MHz, which is band-pass filtered. This product is then down-converted with a 1210.025 MHz local oscillator signal to product a 46 MHz IF signal. In this example, $f_{RF}$=693.975 MHz, $f_1$=1210.025 MHz, and $f_2$=1950 MHz., and $f_{IF}=|(f_2-f_1)-f_{RF}|$.

In another embodiment, RF converter 84 (and RF converter 84') is configured as a downconverter stage for a DTV receiver. In this case, signal 126 is or is derived from a received RF signal. IF amplifier 78 is eliminated or optionally replaced by a suitable RF amplifier. Filters in signal path 170 select mixing products from mixers 176 and 178 so that output 82 of signal path 170 is a baseband or an IF signal, where either $f_{IF}=|(f_1-f_2)-f_{RF}|$ or $f_{IF}=|(f_2-f_1)-f_{RF}|$, depending upon a design choice implemented by the filtering.

It will be apparent that the low phase noise, high resolution features of RF converter 84 (and RF converter 84') do not depend upon its use in a digital television receiver or transmitter circuit. Therefore, in other embodiments, RF converter 84 (and RF converter 84') is used in other devices in which low phase noise and high frequency resolution provide useful advantages.

The components of the invention can be implemented using analog circuitry, digital logic circuitry, microprocessors, ASICs, software running on computer systems, or other comparable devices, or various combinations or subcombinations of these devices, as will be understood by those of ordinary skill in the art.

While the invention has been described in terms of various specific embodiments, those skilled in the art will recognize that the invention can be practiced with modification within the spirit and scope of the claims

The invention claimed is:

1. A frequency converter for shifting the frequency of an input signal by a desired frequency, the frequency converter comprising:
   (a) first oscillator means for producing a first signal at a first frequency and configured to receive an external reference frequency signal, the first signal derived with reference to the external reference frequency signal;
   (b) second oscillator means for producing a second signal at a second frequency also configured to receive the external reference frequency signal, the second signal derived with reference to the external reference frequency signal;
   (c) frequency conversion means for converting the frequency of the input signal equal to a frequency difference of the first signal and the second signal; and
   (d) mixing means for mixing said first signal and said second signal to produce a frequency difference signal representative of the frequency difference between the first and second signals; and
   (e) sampling means for sampling the frequency difference signal with a synthesized reference signal derived from the external reference signal such that aliasing results in an error signal corresponding to a frequency difference between the difference signal and a desired frequency shift, said the sampling means is configured to derive the synthesized reference signal from the external reference signal;
   (f) one of said first oscillator means and second oscillator means being responsive to the error signal to adjust the frequency of the first signal and second signal, respectively.

2. The frequency converter as claimed in claim 1, wherein said sampling means comprises a pulse train generator configured to receive an external reference frequency signal and generate, with reference to the external reference frequency signal, the synthesized reference signal, the synthesized reference signal having a harmonic at a frequency corresponding to the desired frequency shift.

3. The frequency converter as claimed in claim 2, wherein said pulse train generator comprises a direct digital synthesis circuit, a comparator for clipping the output of said direct digital synthesis circuit and a comb generator for converting the edges of the output of said comparator to delta pulses.

4. The frequency converter as claimed in claim 2, wherein said sampling means comprises a mixer for mixing said difference signal and said synthesized reference signal to produce said sampled signal.

5. The frequency converter as claimed in claim 1 wherein the input signal is a frequency shifted orthogonal frequency division multiplexed signal.

6. The frequency converter as claimed in claim 5 wherein the frequency converter is an upconverter for converting an input signal from an intermediate frequency to a higher frequency.

7. The frequency converter as claimed in claim 5 wherein the frequency converter is a downconverter for converting an input signal from a higher frequency to a lower intermediate frequency.

8. The frequency converter as claimed in claim 5 wherein the input signal is a digital television signal.

9. A frequency converter for shifting the frequency of an input signal by a desired frequency, and that receives an external reference frequency signal, the frequency converter comprising:
   (a) a first oscillator that receives the external reference frequency signal and that produces a first signal at a first frequency;
   (b) a second oscillator, responsive to a error signal, that receives the external reference frequency signal and that produces a second signal at a second frequency, said input signal being shifted in frequency by the difference between said first frequency and said second frequency;
   (c) a difference circuit, comprising a difference mixer and a difference low pass filter, said difference mixer receiving said first signal and said second signal and producing a mixed signal, and said difference low pass filter filtering said mixed signal to produce a difference signal;
   (d) a pulse train generator that receives the external reference frequency signal and that generates a pulse train signal with a harmonic at the desired frequency; and
   (e) a sampler circuit for receiving said pulse train signal and said difference signal to produce said error signal.

10. The frequency converter claimed in claim 9, wherein said first oscillator comprises a first local oscillator and a first frequency synthesizer connected in an oscillator loop and wherein said second oscillator comprises a second local oscillator and a second frequency synthesizer connected in an oscillator loop.

11. The frequency converter claimed in claim 10, wherein said second oscillator further comprises a switch connected to said second local oscillator for selecting as an input said second frequency synthesizer or said error signal.

12. The frequency converter claimed in claim 11, wherein said first oscillator shifts the frequency of said input signal upwards and outputs a shifted signal, and wherein said second oscillator shifts the frequency of said shifted signal downwards and outputs an output signal, said output signal having a frequency higher than the frequency of said input signal by the desired frequency.

13. The frequency converter claimed in claim 11, wherein said first oscillator shifts the frequency of said input signal downwards and outputs a shifted signal, and wherein said second oscillator shifts the frequency of said shifted signal upwards and outputs an output signal, said output signal having a frequency lower than the frequency of said input signal by the desired frequency.

14. An transmitter for transmitting orthogonal frequency division modulated (OFDM) signals, comprising:
   (a) an OFDM transmission engine configured to accept a digital input signal and modulate the input signal onto a plurality of orthogonal carriers to produce a baseband OFDM signal;
   (b) an intermediate frequency converter configured to accept the baseband OFDM signal as input and shift it to an intermediate frequency signal; and
   (c) an RF frequency upconverter for shifting the intermediate frequency (IF) signal by a desired frequency to an RF transmission frequency, including:
      (i) a pair of frequency synthesizers for generating, based on an external frequency reference, signals having a frequency difference therebetween;
      (ii) a converter for shifting the frequency of the IF signal by an amount corresponding to the frequency difference of the signals from the pair of frequency synthesizers;
      (iii) a reference signal generator for generating, based on the external reference signal, an internal reference signal having a harmonic at a frequency corresponding to the desired frequency;
      (iv) a sampler for sampling a frequency difference signal corresponding to the frequency difference of the signals from the pair of frequency synthesizers with the internal reference signal to produce an error signal corresponding to the difference between the frequency difference signal and the desired frequency;
      (v) one of said frequency synthesizers being responsive to the error signal to adjust the frequency of the signal generated thereby to compensate for the difference between the frequency difference signal and the desired frequency.

15. The transmitter of claim 14, wherein said sampler comprises a mixer for generating said error signal from aliasing that results from the mixing of said frequency difference signal and said internal reference signal.

16. The transmitter of claim 15, wherein said reference signal generator includes a pulse train generator comprising a direct digital synthesis circuit, a comparator for clipping the output of said direct digital synthesis circuit and a comb generator for converting the edges of the output of said comparator to produce said internal reference signal as a pulse train signal.

17. A frequency conversion method, for shifting the frequency of an input signal by a desired frequency, comprising the steps of:
   (a) generating a first signal at a first frequency;
   (b) generating a second signal at a second frequency;
   (c) mixing the input signal with said first signal to produce a shifted signal;
   (d) mixing said shifted signal with said second signal to produce an output signal;
   (e) mixing said first signal and said second signal to produce a difference signal;
   (f) comparing said difference signal with a pulse train signal, said pulse train signal having a harmonic corresponding to the desired frequency, producing, through aliasing, a low frequency error signal corresponding to the difference between said difference signal and the harmonic of said pulse train signal; and
   (g) adjusting the frequency of one of said first signal and said second said second signal in response to said error signal.

18. The method of claim 17 wherein said input signal is shifted by an amount equal to the frequency difference between the first signal and the second signal from an intermediate frequency to a higher RF transmission frequency.

19. The method of claim 17 wherein said input signal is shifted by an amount equal to the frequency difference between the first signal and the second signal from an RF transmission frequency to a lower intermediate frequency. signal.

* * * * *